United States Patent [19]

Kroger

[11] 4,421,785
[45] * Dec. 20, 1983

[54] SUPERCONDUCTIVE TUNNEL JUNCTION DEVICE AND METHOD OF MANUFACTURE

[75] Inventor: Harry Kroger, Sudbury, Mass.

[73] Assignee: Sperry Corporation, New York, N.Y.

[*] Notice: The portion of the term of this patent subsequent to Nov. 27, 1996 has been disclaimed.

[21] Appl. No.: 179,311

[22] Filed: Aug. 18, 1980

[51] Int. Cl.³ ............................................. B05D 5/12
[52] U.S. Cl. ...................................... 427/63; 427/85; 427/86; 427/88; 427/89; 427/93; 427/96; 427/404; 427/419.3
[58] Field of Search ...................... 427/63, 93, 96, 85, 427/86, 88, 89, 255, 255.4, 404, 419.3; 357/5

[56] References Cited

U.S. PATENT DOCUMENTS 3,911,168  10/1975  Schinella et al. ...................... 427/93
4,176,365  11/1979  Kroger ..................................... 357/5
4,214,919   7/1980  Young .................................... 427/93
4,246,296   1/1981  Chang .................................... 427/93

OTHER PUBLICATIONS

Walter, IBM Tech. Dis. Bul. vol 18, No. 7, 1975, p. 2328.

Primary Examiner—Michael R. Lusignan
Assistant Examiner—Richard Buekes
Attorney, Agent, or Firm—Howard P. Terry

[57] ABSTRACT

A Josephson tunnel junction device having niobium nitride superconductive electrodes includes a polycrystalline semiconductor tunneling barrier therebetween comprised of silicon, germanium, or an alloy thereof preferably deposited on the lower superconductive electrodes by vapor deposition. The barrier thickness of the junction is controlled by precision doping of the semiconductor material. The active junction is defined after the interfaces between the barrier material and the two superconductor lines are formed, retaining those active interfaces in fully unpolluted character.

15 Claims, 12 Drawing Figures

SUPERCONDUCTIVE TUNNEL JUNCTION DEVICE AND METHOD OF MANUFACTURE

BACKGROUND OF THE INVENTION

1. Field of the Invention

The invention relates to superconductive switching elements and gates and more particularly to improved Josephson tunnel junction devices for performing such functions.

2. Description of the Prior Art

Superconductive memory and logic circuits are well known in the art which utilize the Josephson tunnel junction as an active switching or gating element. The Josephson tunnel junction device may also be employed as a magnetic field sensor, as in magnetometers and in electromagnetic wave detectors. The Josephson junction device normally comprises two adjacent layers of superconductive material with a barrier layer therebetween; Josephson tunneling current flows from one superconductive layer to the other through the barrier by use of the Josephson tunneling effect. With the superconductive layers connected into a superconductive loop and with control lines disposed adjacent the junction, the Josephson zero-voltage direct current flowing through the device is controlled so as to provide the necessary current steering and control functions in associated circuits.

A particular Josephson junction device, as well as problems attendant prior art devices, is described in U.S. Pat. No. 4,176,365, entitled "Josephson Tunnel Junction Device with Hydrogenated Amorphous Silicon, Germanium or Silicon-Germanium Alloy Tunneling Barrier", issued Nov. 27, 1979 in the name of Harry Kroger and assigned to Sperry Corporation.

As discussed in the Kroger patent, it is desirable to provide Josephson junction devices capable of supporting large critical current densities while still utilizing relatively thick barrier layers so as to provide structural rigidity and reliability and to decrease device capacitance. Oxide insulator tunneling barrier layers have generally been unsatisfactory in the past in that only relatively thin and consequently fragile insulator barriers could pass large Josephson direct currents, the thin barriers resulting in Josephson devices with undesirably high capacitance. The device of the aforementioned Kroger patent utilizes appropriately doped amorphous hydrogenated silicon, germanium, or alloys thereof as the barrier layer material, which arrangement successfully provides an unusually high current density through a suitably thick tunneling barrier layer.

Also providing readily reproducible high current density, small Josephson superconducting loops utilizing small area tunnel junctions and having barriers of sufficient thickness are the devices of the Harry Kroger U.S. patent application Ser. No. 23,487, filed Mar. 23, 1979 for a "Josephson Tunnel Junction Device with Polycrystalline Silicon, Germanium, or Silicon-Germanium Alloy Tunneling Barrier". As discussed also in U.S. Pat. No. 4,176,365, it is desirable to utilize refractory superconductive metals in fabricating Josephson junction devices. Generally, non-refractory materials have been used in prior art devices. Although non-refractory superconductive metals such as lead, indium, and tin and alloys thereof exhibit suitable superconductive properties, these materials cause difficulties when fabricating superconducting integrated circuits using fine line connections. Printed circuit fabrication techniques that tend partially to ameliorate these difficulties tend to be more complicated than more conventional fabrication techniques that presently produce high yield integrated circuits of a more conventional variety, such as in ordinary semiconductor circuits. In place of the soft, relatively low melting point superconductive metals mentioned, aluminum has been utilized as the superconductor to alleviate the problem, but aluminum has a significantly lower superconductive transition temperature than, for example, lead and therefore it requires much more energy to refrigerate the devices.

Patent application Ser. No. 23,487 now U.S. Pat. No. 4,220,959, additionally concerns an improvement like that of the earlier Kroger application that overcomes additional disadvantages of the prior art. Again, the invention is a Josephson junction device comprising first and second layers of superconductive material superposed one with respect to the other, the lower one of the layers comprising a refractory compound superconductive metal. A barrier layer is introduced between the first and second superconductive layers whereby Josephson tunneling current flows between the superconductive layers, the barrier layer comprising polycrystalline semiconductor material selected from the group consisting of silicon, germanium, and alloys thereof. Particularly, the lower superconductive layer is comprised of niobium nitride and the barrier layer is deposited thereon by chemical vapor deposition. The semiconductor barrier layer may be intrinsic or may be precisely doped to demonstrate either an n or p-type nature.

SUMMARY OF THE INVENTION

The present invention discloses a method of fabricating improved superconductive tunneling devices of the kind using refractory superconductors in cooperation with tunneling semiconductor or oxide barrier layers and also discloses novel structures made according to the method. The invention is particularly concerned with Josephson tunneling devices. The Josephson active area is defined by a local anodization or oxidation process exercised only after the first and second super conducting layers are formed, a sequence of events important in that it permits impurities at the sealed tunneling barrier layer interfaces to be minimized. In addition to producing inherently cleaner interfacial regions at the tunneling barrier, the method permits easy and convenient fabrication of novel geometric variations of past Josephson devices. According to the invention, past practices are avoided in which an insulator layer is deposited and then a window is opened in it to define the active area of the Josephson tunnel device. Also avoided are past methods that define the area of the tunnel junction by partially overlapping the superconductors, depositing first superconductor, barrier, and second superconductor layers without interruption by intervening photoresist steps, or depositing a first super conductor layer, growing an oxide barrier and depositing a second superconductor layer. According to the present invention, the barrier layer is deposited or grown and the second superconductor layer is deposited before the insulator is formed, thus assuring that the barrier purity and effectiveness are reliably maintained.

DESCRIPTION OF THE PREFERRED EMBODIMENTS

In the construction of the novel Josephson tunneling device, a first step is to select a conventional substrate 2 upon which a superconducting layer 1 may be formed using a selected well-established procedure. Substrate 2 may consist of detailed elements (not shown) including an external layer of oxidized silicon, an intermediate layer of refractory superconductor material, such as niobium, and an insulating layer which will ultimately interface with superconducting layer 1, in the usual manner. These and other pertinent structures and methods are taught in the aforementioned Kroger U.S. Pat. No. 4,176,365 and in patent application Ser. No. 23,487; the two documents are hereby individually incorporated in total within the present application.

Figure 1:
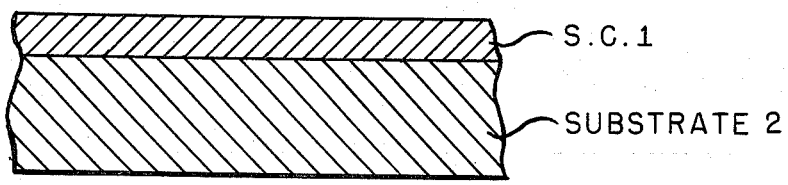
FIGS. 1 through 4 are cross-sectional views of the invention showing successive steps in its construction.

Substrate 2 may include a base or external layer of a crystalline silicon substrate with an oxidized surface; next is deposited on the oxide surface a layer 1000 to 5000 Angstroms thick of niobium formed in a conventional way by sputtering to serve as a transmission line ground plane. A silicon dioxide or amorphous silicon dielectric layer is finally formed on the free surface of the dielectric layer to a depth of 1000 to 20,000 Angstroms. In this manner, the essentially conventional base portion 2 of the device is formed which may then be prepared to accept a particular Josephson device configuration on its dielectric surface, as in FIG. 1, where a first superconductor layer 1 is shown formed on substrate 2, patterning of layer 1 being generally not necessary according to the invention. Layer 1 may be niobium sputter-deposited in the usual manner to a depth of about 2000 to 3000 Angstroms.

Figure 2:
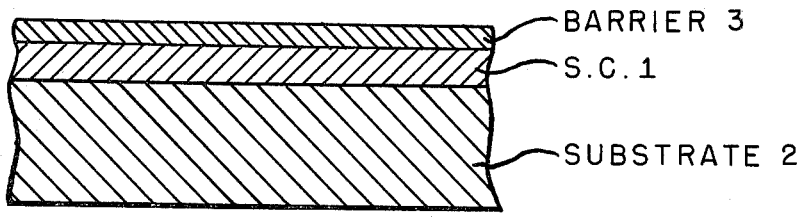

In the same vacuum chamber and without interruption, the succeeding step of r.f. diode sputter deposition of a 30 to 400 Angstrom thick tunneling barrier layer 3 (FIG. 2) is performed, for example in a partial hydrogen atmosphere. The barrier layer 3 is comprised, for example, of amorphous hydrogenated silicon or of amorphous hydrogenated germanium or of alloys thereof. Further, the barrier layer material may be doped with a type n or p dopant during the deposition step by the addition of phosphene to the sputtering atmosphere. For relatively thin forms of the semiconductor barrier layer 3, there may be a need for a surface oxidation step to plug any pin holes adversely formed through the semiconductor material, though this is normally an optional step. Advantageously, no patterning of the barrier layer 3 needs to be undertaken according to this method.

As described in the aforementioned U.S. Pat. No. 4,176,365, an unexpectedly large increase in Josephson current density is obtained by use of the amorphous hydrogenated silicon, amorphous hydrogenated germanium, or amorphous hydrogenated silicon-germanium alloy as a tunneling barrier in the novel Josephson junction devices. For example, it was found that a prior art amorphous unhydrogenated silicon barrier about 30 Angstroms thick passed a maximum Josephson current of 120 amperes per square centimeter. On the other hand, a hydrogenated phosphorous-doped amorphous silicon barrier about 60 Angstroms thick supported a Josephson current density of 2000 to 4000 amperes per square centimeter.

A further step is now performed preferably within the same vacuum chamber and without interruption for forming the second of the two parallel superconducting layers at 5 upon barrier 3 either by electron beam evaporation or by sputter deposition at a 20 $\mu$T pressure of argon of a layer 200 to 400 Angstroms thick, for instance, of a refractory superconductor such as niobium. Layer 5 will serve as the counter-electrode with respect to the semiconductor barrier 3 and is made relatively thin so that portions thereof may subsequently be completely anodized or oxidized.

Figure 3:
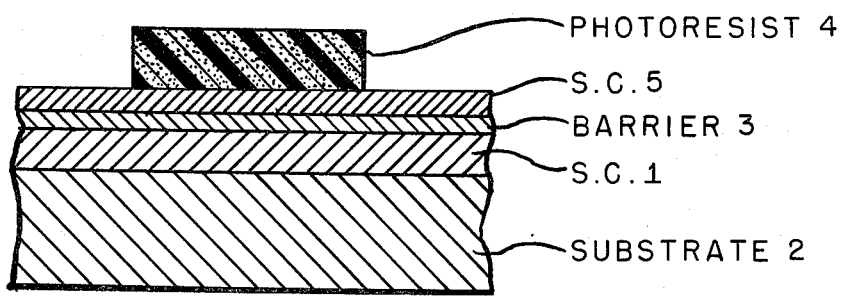

As in FIG. 3, a conventional photoresist layer 4 is next applied to the free surface of superconductor layer 5. Application of the resist and its exposure and development are achieved in the ordinary manner so that the protective photoresist pattern 4 is left on the superconductor 5 surface only over the region 5' where an isolated active Josephson barrier is to be formed.

Figure 4:
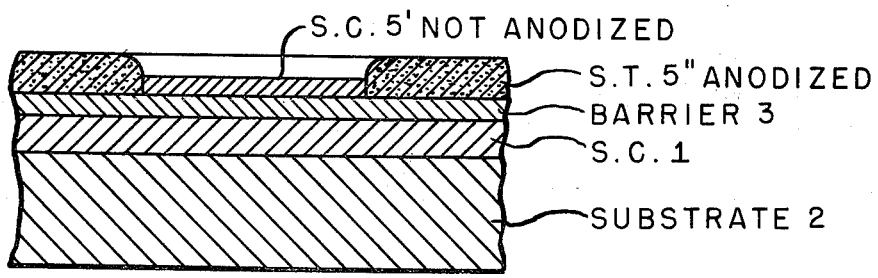
Figure 6:
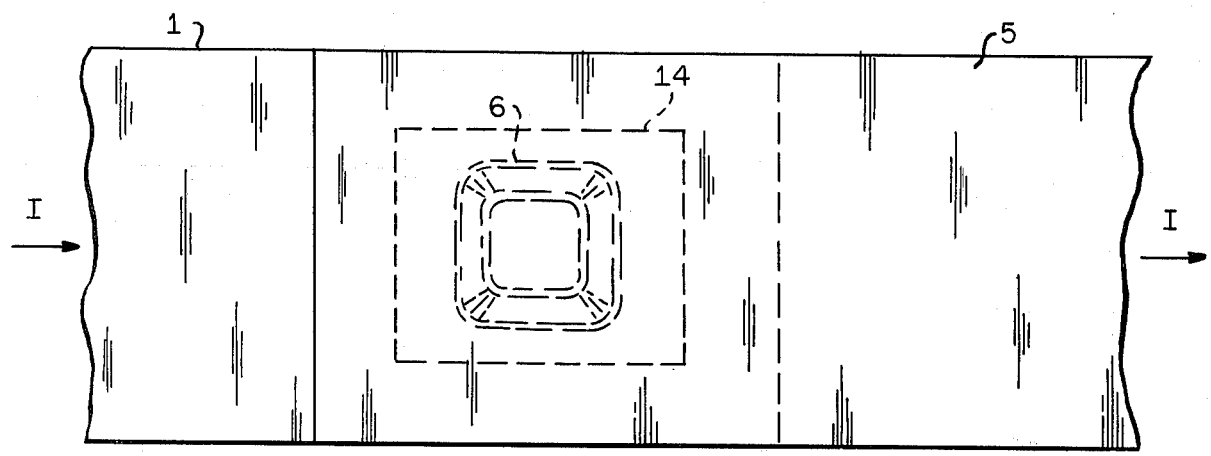
FIG. 6 is a top view of the structure of FIG. 4.

Referring to FIGS. 3 and 4, it is to be noted that the active barrier region may be square as suggested in FIG. 6 or may have other shapes such as rectangular, circular, oval, et cetera. The active barrier region, as made according to the present invention, is strictly defined after the superconducting elements or lines are deposited in the vicinity of the proposed junction and, in this manner, subsequent chemical or other treatment of the wafer can have no adverse effects upon the purity of the barrier itself.

In the next succeeding step, the superconductor layer 5 is protected as seen in FIG. 4 except within the region 5' covered by resist 4 and the photoresist island 4 is then removed in the conventional manner. The superconducting layer 5 is thus not anodized in the layer region 5' that is simply cross-hatched in the drawing, while it is anodized in the regions 5" both cross-hatched and stippled. In niobium-amorphous silicon-niobium structures, for example, the present anodization method is preferred because of chemical reactions and interdiffusions which may adversely take place in other methods between niobium and silicon at about 300° C.

Figure 5:
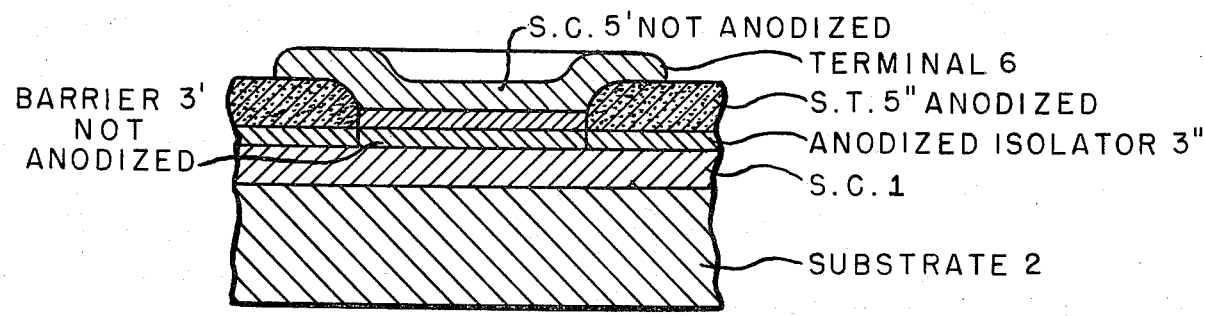
FIG. 5 is similar to FIGS. 1 through 4 and may be regarded as illustrating a partial or final product made according to the invention.

Anodization of the indicated portion 5" of superconducting layer 5 may be accomplished as in FIG. 4 to provide sufficient isolation of the active Josephson junction in many cases by oxidizing or anodizing superconductor layer 5 just to the interface between layers 5 and 3. It will be understood that part of the layer 5 grows somewhat thicker during the anodizing or oxidizing process; for example, anodizing about 7 Angstroms of niobium produces a layer of niobium oxide about 20 Angstroms thick. If silicon is used as the semiconductor of barrier 3, the latter layer 3 may additionally be partly or fully anodized or oxidized in the region 3" not shielded by the photoresist island 4, as shown in FIG. 5. As in FIG. 5, there are provided, as one alternative, the non-anodized barrier layer and superconductor regions 3' and 5' respectively surrounded by anodized insulating semiconductor material 3" and superconductor material 5" also anodized or oxidized to form an insulating portion. The anodized region is chosen to be so thick that tunneling can not take place through it.

Electrolytic anodization may be accomplished for forming electrically resistive layers with respect to the refractory and semiconductor materials according to well known practice using a solution of ammonium pentaborate and ethylene glycol in water where the material to be anodized serves as the anode, the cathode being a Pt electrode. About 7.5 Angstroms of the niobium layer are consumed and about 20 Angstroms of niobium oxide is produced for each volt applied to the anodization cell. After the anodization step, the photoresist island 4 may be removed according to conventional practice and the partial product, as in FIGS. 4 or 5, is completed and ready for modification to fit the particular needs of the structure in which it is to be employed.

To prepare the partial product for that purpose, selected; generally conventional steps may be taken. Any desired external patterning of the periphery of the unanodized portions of barrier layer 3 and of the input superconductor layer 1 remote from the active Josephson region may be performed with one photoresist application and plasma etching through both of the layers. An insulating silica layer may then be deposited and patterned, as needed, over undesired bare conductor edges produced in the foregoing step. Deposition and patterning of further control superconducting lines on the upper surface of the partial product may then be undertaken, as desired.

Figure 7:
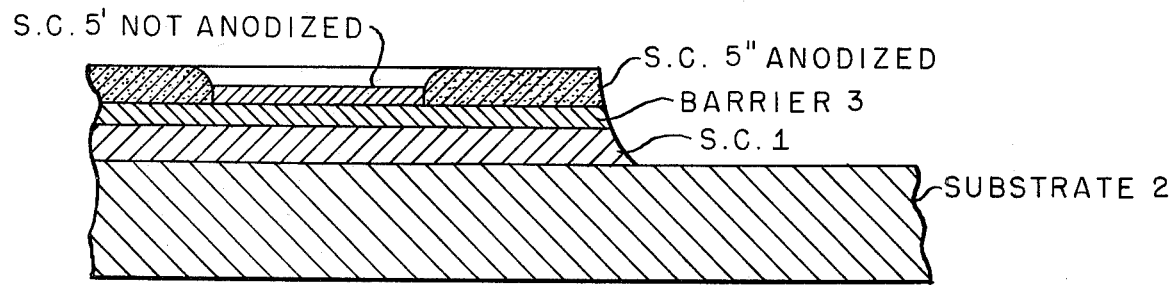
FIGS. 7, 8, and 9 are cross-sectional views of one alternative form of the invention showing successive steps in its construction.
Figure 8:
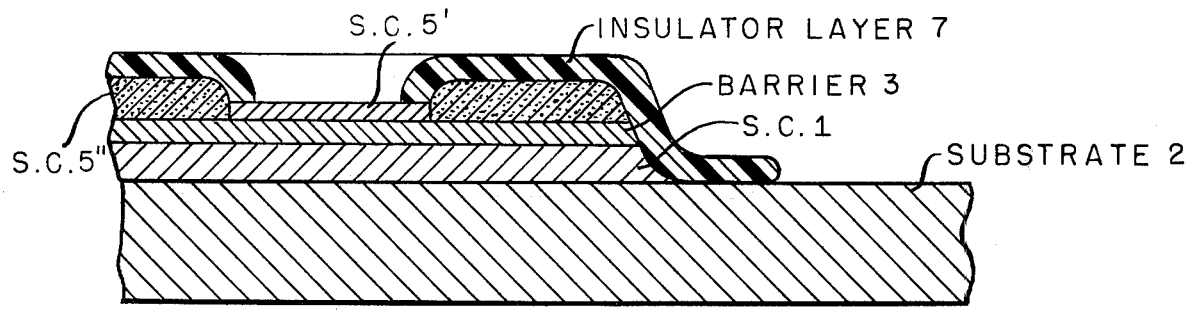
Figure 9:
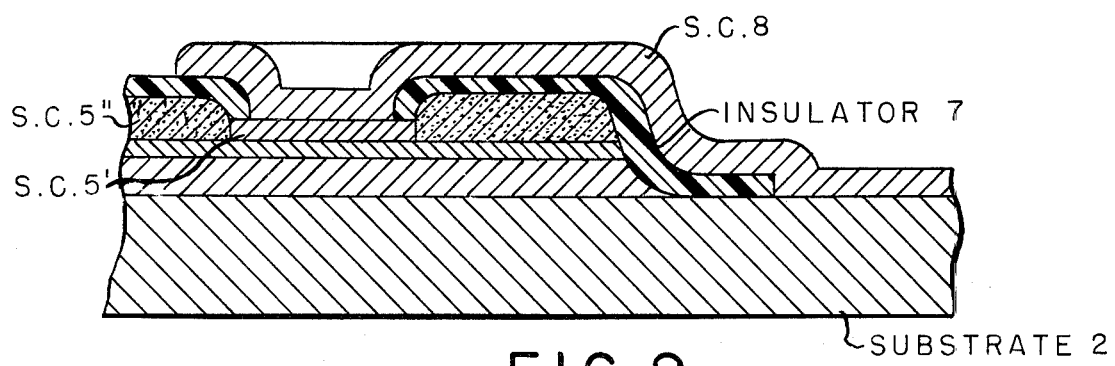

For example, reference may be had to FIGS. 7, 8, and 9, which illustrate construction steps that may be taken subsequent to those illustrated in FIGS. 4 or 5. Patterning of the anodized layer 5" and of the lower superconductor layer 1 may be performed with a single photoresist application and plasma etching through both the anodized and unanodized layers simultaneously. The step may alter the structure of FIG. 4 to remove layers 1, 3, and 5" above substrate 2, as shown in FIG. 7. As in FIG. 8, an insulating layer 7 is then deposited and patterned over the layered structure, but over only a part of the exposed substrate 2. Insulator layer 7 serves primarily to cover conductor edges which must not remain exposed indefinitely. As in FIG. 9, the superconducting layer 8 may then be deposited so that it ohmically contacts superconductor contact 5', extending over the layered structure and then over a surface of substrate 2.

In the aforementioned patent application Ser. No. 23,487, other refractory semiconductors are taught that may be employed in the present configuration. In particular, the refractory compound superconductive metal niobium nitride does not react with hydrogen at temperatures up to 750° C. in concentrations thereof required to deposit polycrystalline silicon, germanium, or alloys thereof. Furthermore, niobium nitride does not react with silicon or germanium or alloys thereof at the temperatures up to 750° C. required for the chemical vapor deposition of these materials at atmospheric pressure. Thus, niobium nitride may be utilized as the superconductive material in the present Josephson junction devices where polycrystalline silicon, germanium, or alloys thereof are to be chemically vapor deposited. It is also believed that other compound refractory superconductors such as niobium-tin ($Nb_3Sn$) and niobium-germanium ($Nb_3Ge$) may be utilized to the same effect. The niobium nitride layers 10 and 11, for example, may be deposited by reactive sputtering of niobium in a partial nitrogen atmosphere onto a substrate heated to approximately 600° C. or, alternatively, by chemical vapor deposition.

Returning attention to FIG. 3, an alternative procedure is to avoid the use of the resist island 4 by depositing and patterning a different insulator layer, such as silica, so that it is left only over the region under which the Josephson device is to be placed. The silica island is again used to block anodization of the total of the active junction area 5°. For small area junction devices, the use of the silica layer may provide more accurate control over the area of the active barrier region which is not to be anodized than does the photoresist island, since the resist may tend to lift off at higher anodization voltages. When it is to be removed, the silica island may be subjected to a conventional buffered hydrofluoric acid solution adjusted so that the etch rate of the silica is 10 to 15 times that of the anodized niobium.

Alternative to anodization, the counter superconducting electrode may be patterned by thermal oxidation, depending upon the materials present. For a structure using NbN and Si, thermal oxidation is preferred because layers of NbN thicker than about 150 Angstroms are more difficult to anodize completely than to oxidize thermally, NbN and Si not reacting below 750° C. Following thermal oxidation, the $SiO_2$ layer may be removed in a conventional manner, as by using a buffered HF acid solution which will attack $SiO_2$ faster than the oxidized superconductor. If the differential etch rate is not high enough, photoresist masking may be used to prevent any chemical attack of the anodized material. Deposition and patterning of the insulator layer and of the upper superconducting layer may then proceed as in the foregoing.

The invention may also be practiced employing a barrier layer that is a native oxide of the lower superconductor. Instead of depositing a semiconductor barrier, the native oxide barrier is grown conventionally by thermal oxidation, plasma oxidation, chemical oxidation, or by some combination thereof before the counter superconductor electrode is deposited.

The methods of the invention offer the advantage that neither of the interfaces between a superconductor and the associated semiconductor barrier has to be exposed to any wet chemical processes of the prior art or to any contamination that may be present in the vacuum system. Since the latter is normally a high quality, high vacuum system, contamination during steps taking place in vacuum is actually not likely. The methods also ensure reliably reproducible products, eliminating uneven coverage of the lower superconductor by the barrier layer. Pairs and other multiplicities of Josephson junctions may readily be simultaneously produced. Also various shapes of the junction may be selected, further illustrating the versatility of the invention.

Figure 10:
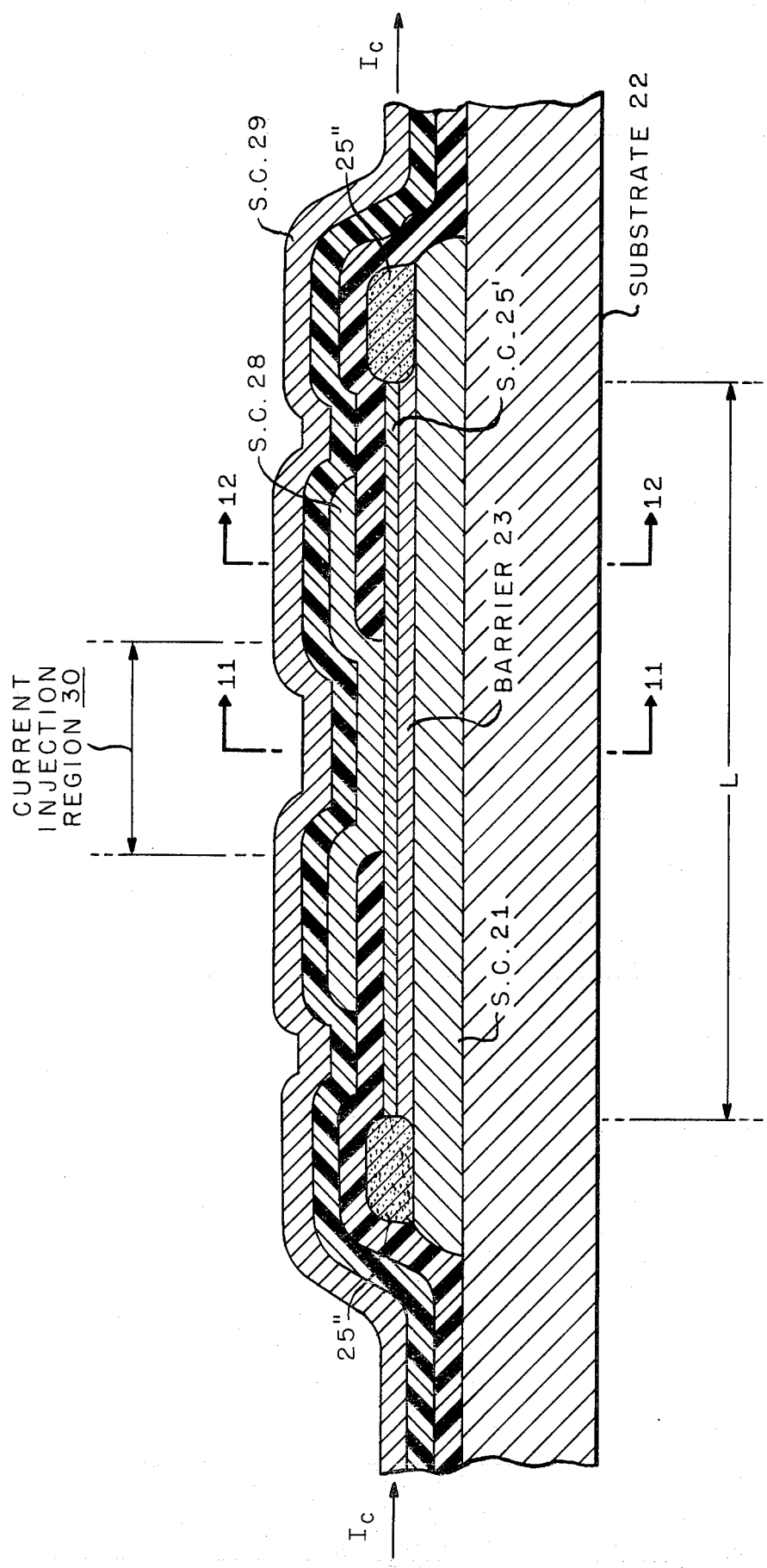
FIG. 10 is a cross-sectional view of a further alternative form of the invention.
Figure 11:
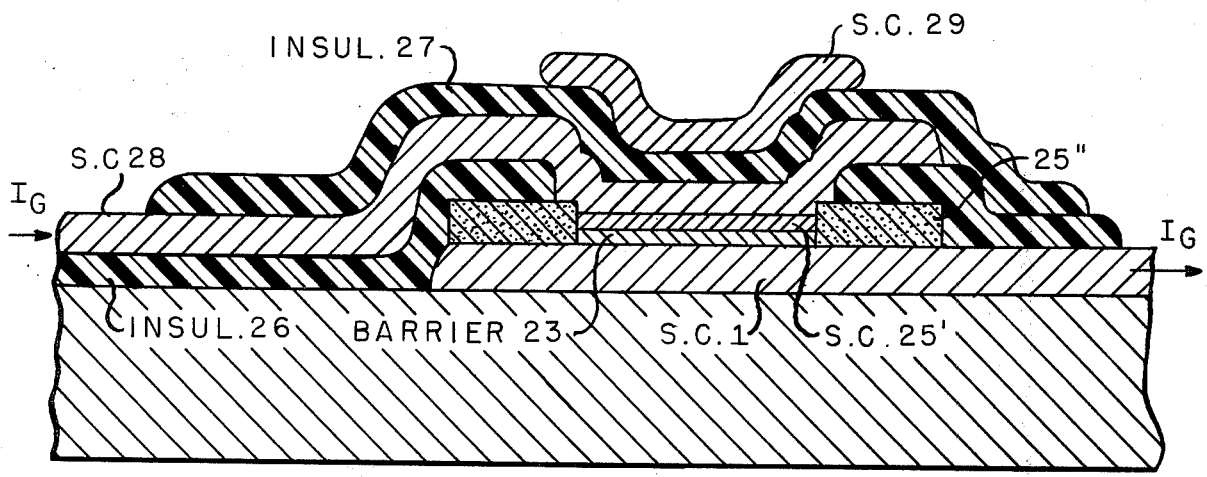
FIGS. 11 and 12 are cross-sectional views taken across the respective lines 11—11 and 12—12 of FIG. 10.
Figure 12:
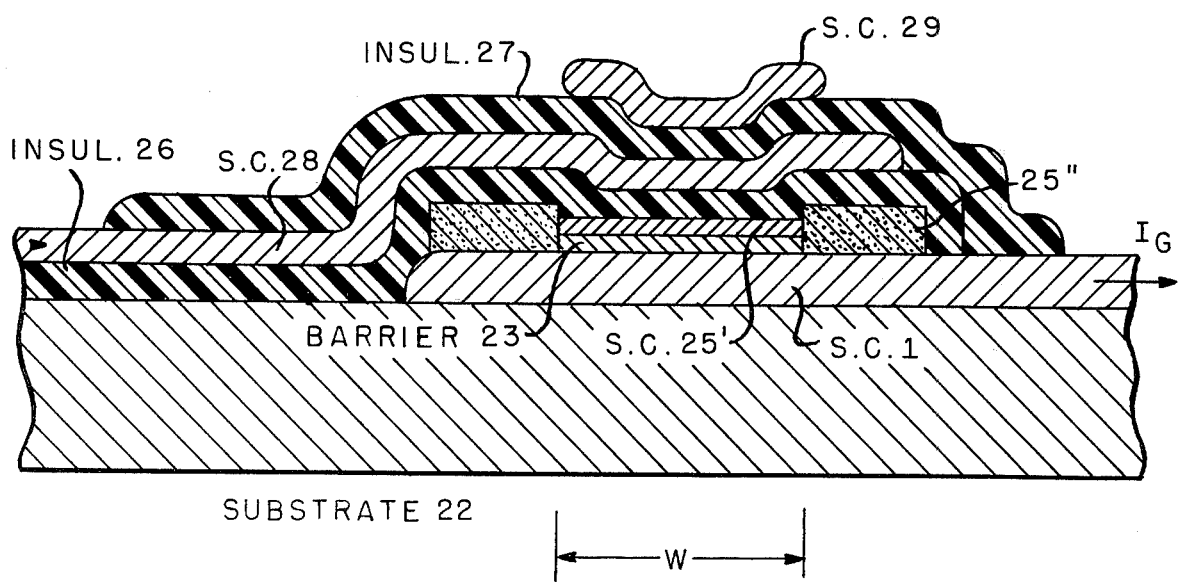

The versatility of the invention is represented in the foregoing embodiments in otherwise generally conventional Josephson tunnel junction devices and is further confirmed by considering its utility in the vortex type of Josephson junction as described by K. K. Likharev, V. K. Semenov, O. V. Snigirev, and B. N. Todorov in a technical paper in the January 1979 issue of the *I.E.E.E. Transactions on Magnetics*, Vol. MAG-15, No. 1, pages 420 through 423. While this technical paper gives no insight into how a practical structure can be devised and makes confusing use of the word "transistor", it may be shown that a fully practical embodiment may be constructed using the present invention as seen in FIGS. 10, 11, and 12.

It will be seen that the method and structure of the present invention may be extended to enable the convenient and simple production of limited-area current injection devices of the general kind suggested by Likharev et al. These limited-area current injection devices have a long, thin shape, with the length L of the barrier 23 in FIG. 10 being large compared to the Josephson penetration depth $\lambda_J$ defined by:

$$\lambda_J = (\Phi_o/2\pi\mu d j_o)^{\frac{1}{2}}$$

where $\Phi_o$ is the flux quantum constant equal to $2.07 \times 10^{-5}$ volt-seconds, $\mu$ is the permeability of the tunneling barrier medium $j_o$ is the maximum Josephson current density obtainable with a small area barrier, and d is the sum of the barrier thickness and the London penetration depths in the cooperating superconductors. The width W of barrier 23 is less than or equal to $\lambda_J$.

In FIG. 10, the substrate 22 is similar in structure and in purpose to substrate 2 of FIGS. 1 through 9, including a superconductive ground plane and an interface layer of dielectric isolation materials. A layer 21 of superconductor material is placed upon a portion of the dielectric isolation layer of substrate 22. A barrier layer 23 is next set down on superconductor layer 21 and the superconductor layer 25' is then set down on layer 23. Layers 23, 25' have the aforementioned length L. By treating the end portions of layers 23, 25', the isolators 25", 25" are formed, as before by the oxidation, as by anodization of portions of the barrier 23 or of contiguous portions of both the barrier 23 and the superconductor layer 25'.

To define the area 30 of current injection, an insulating layer 26 is set down, as before, over most of the superconductor layer 25° except for the masked injection region 30. Next, a superconductor layer 28 is deposited on the current injection region 30 of layer 25', extending also over adjacent portions of insulator layer 26, forming the gate electrode. As seen in FIG. 11, the gate current $I_G$ flows in superconductor gate electrode 28 in a direction perpendicular to the plane of FIG. 10. A second insulator 27 is deposited over the free surface of insulator 26 and over superconductor layer 28 to provide insulation between layer 28 and a final superconductor layer 29 acting as the superconductive current control line.

The prominant feature of the FIG. 10 embodiment lies in its beneficial incorporation, according to the present invention, of a Josephson active area defined precisely by a local anodization or oxidation process exercised only after the first and second superconducting electrodes are formed, a sequence of events important in that it prevents impurities within the sealed tunneling barrier layer interfaces to be minimized. In practice, the device of FIGS. 10, 11, and 12 is an inductively controlled device in which the control line 29 runs parallel to the long dimension L of the barrier 23, so that the magnetic field produced by the current in the control line is substantially perpendicular to the dimension L. In FIGS. 11 and 12, it is seen that the control current $I_c$ flows in superconductor 29 out of the plane of the drawings and that current $I_G$ flows parallel to the plane of the drawings. Referring again particularly to FIG. 10, it is important that the gate current $I_G$ be fed and removed only from the sides of the device. While FIG. 10 shows only one current injection region, an array of such injection regions may be used in place of the single illustrated region 30. Defining the active area or areas by local anodization or other oxidation is beneficially used in the FIG. 10 structure also to provide strictly equal active contiguous areas for the barrier 23 and the superconductive electrode 25'. The invention has been illustrated in the several drawings wherein dimension and proportions have been distorted as in the usual practice in an effort to make clear the actual structure of the apparatus. It will therefore be understood that the thicknesses of the various layers as shown in the drawings are not necessarily those which would be selected by the expert practitioner.

Although several exemplary barrier materials and methods of forming the barriers have been described hereinabove, it is appreciated that any appropriate barrier material deposited or formed by any suitable method may be utilized in practicing the invention.

While the invention has been described in its preferred embodiments, it is to be understood that the words which have been used are words of description rather than of limitation and that changes may be made within the purview of the appended claims without departing from the true scope and spirit of the invention in its broader aspects.

I claim:

1. A method of manufacturing a superconductive tunnel junction device including at least one superconductive tunnel junction defined as a predetermined active region comprising the steps of forming a first layer of superconductive material on said substrate, forming a barrier layer of barrier material on said first layer, forming a second layer of superconductive material on said barrier layer, and rendering insulating at least the entire thickness of said second layer of superconductive material except at said predetermined active region for defining said tunnel junction, and with the exception of said first layer of superconductive material which remains substantially unconverted to insulating material, the unconverted second layer at said predetermined active region providing an upper electrode for said tunnel junction, the barrier layer underlying said upper electrode providing a tunnelling barrier for said tunnel junction and the unconverted first layer underlying said tunnelling barrier providing a lower electrode for said tunnel junction, electrical contact to said lower electrode being effected through the unconverted first layer laterally adjacent said predetermined active region.

2. The method of claim 1 in which said step of rendering insulating comprises rendering insulating by oxidation.

3. The method of claim 2 in which said step of rendering insulating comprises rendering insulating by anodization.

4. The method of claim 2 in which said step of rendering insulating comprises rendering insulating by oxidation in situ.

5. The method of claim 1 in which said step of rendering insulating further includes rendering insulating at least a portion of the thickness of said barrier layer in alignment with underlying the portions of said second layer of superconductive material rendered insulating.

6. The method of claim 3 in which said step of rendering insulating includes anodizing at least a portion of the thickness of said barrier layer in alignment with and underlying the anodized portions of said second layer of superconductive material.

7. The method of claim 1 in which said step of forming said barrier layer comprises the step of depositing a barrier layer of semiconductor material on said first layer.

8. The method of claim 7 in which said step of depositing said barrier layer on said first layer comprises deposition of said semiconductor material selected from the group consisting of amorphous and polycrystalline germanium, silicon, and alloys thereof.

9. The method of claim 7 further including the step of doping said semiconductor material during said deposition thereof.

10. The method of claim 1 in which at least one of said steps of forming said first and second layers comprises depositing a layer of refractory superconductive material.

11. The method of claim 10 in which at least one of said steps of forming said first and second layers comprising depositing a layer of superconductive material selected from the group consisting of niobium and niobium nitride.

12. The method of claim 1 in which said step of rendering insulating includes the step of depositing an oxidation mask on said second layer for defining said tunnel junctions, said oxidation mask comprising an insulating material.

13. The method of claim 1 in which said step of rendering insulating includes the step of depositing an oxidation mask on said second layer for defining said tunnel junction, and oxidation mask comprising a photoresistive material.

14. The method of claim 1 in which said step of rendering insulating includes the step of depositing an oxidation mask on said second layer for defining said tunnel junction, said oxidation mask comprising a refractory insulator.

15. The method of claim 1 in which said step of rendering insulating includes the step of depositing an oxidation mask on said second layer for defining said tunnel junction, said oxidation mask comprising silica.

* * * * *